US009546089B1

(12) United States Patent
Hu et al.

(10) Patent No.: US 9,546,089 B1
(45) Date of Patent: Jan. 17, 2017

(54) PRESSURE SENSOR AND PACKAGING METHOD THEREOF

(71) Applicant: MEMSensing Microsystems Co., Ltd., Suzhou (CN)

(72) Inventors: Wei Hu, Suzhou (CN); Gang Li, Suzhou (CN)

(73) Assignee: MEMSensing Microsystems Co., Ltd., Suzhou (CN)

( * ) Notice: Subject to any disclaimer, the term of this patent is extended or adjusted under 35 U.S.C. 154(b) by 0 days.

(21) Appl. No.: 14/883,316

(22) Filed: Oct. 14, 2015

(30) Foreign Application Priority Data

Aug. 6, 2015 (CN) .......................... 2015 1 0477434

(51) Int. Cl.
  *G01P 15/08* (2006.01)
  *B81B 7/00* (2006.01)
  *B81C 1/00* (2006.01)

(52) U.S. Cl.
  CPC ......... *B81B 7/0058* (2013.01); *B81C 1/00325* (2013.01); *B81B 2201/0264* (2013.01); *B81B 2207/03* (2013.01); *B81B 2207/07* (2013.01); *B81C 2203/0136* (2013.01); *B81C 2203/0792* (2013.01)

(58) Field of Classification Search
  CPC ..................... B81B 7/0058; B81B 2201/0264; B81B 2207/07; B81B 2207/03; B81C 1/00325; B81C 2203/0792; B81C 2203/0136
  See application file for complete search history.

(56) References Cited

U.S. PATENT DOCUMENTS

| | | | | |
|---|---|---|---|---|
| 4,838,088 A | * | 6/1989 | Murakami | B81B 3/0021 361/283.4 |
| 8,507,321 B2 | * | 8/2013 | Lin | H01L 21/561 438/113 |
| 2003/0215974 A1 | * | 11/2003 | Kawasaki | B81C 1/00047 438/50 |
| 2006/0148127 A1 | * | 7/2006 | Ong | G01L 19/141 438/106 |
| 2014/0033814 A1 | * | 2/2014 | Wen | G01L 19/14 73/146.5 |
| 2014/0061892 A1 | * | 3/2014 | Ziglioli | B81B 7/0058 257/704 |
| 2015/0014798 A1 | * | 1/2015 | Faralli | B81B 3/00 257/416 |
| 2015/0060956 A1 | * | 3/2015 | Chen | B81C 1/00246 257/254 |

* cited by examiner

*Primary Examiner* — Victor A Mandala
(74) *Attorney, Agent, or Firm* — Zareefa B. Flener; Flener IP Law, LLC

(57) ABSTRACT

According to an embodiment of the present invention, a pressure sensor includes: a pressure sensing chip, which includes a substrate, a sensing film, an insulation layer and a first bonding pad; wherein the sensing film is on the substrate, and a sagging step is formed at one side of the substrate; the insulation layer is prepared on the sensing film and the substrate; the first bonding pad is prepared on the insulation layer on a bottom surface of the step, and is connected to the region of the substrate close to the sensing film via a lead wire.

20 Claims, 3 Drawing Sheets

PRESSURE SENSOR AND PACKAGING METHOD THEREOF

CROSS-REFERENCE TO RELATED APPLICATION

This application claims priority from CN Patent Application Serial No. 201510477434.5, filed on Aug. 6, 2015, the entire contents of which are incorporated herein by reference for all purposes.

FIELD OF THE INVENTION

The present invention is related to technology of microelectrical mechanical system and pressure sensor, and more particularly to a pressure sensor and packaging method thereof.

BACKGROUND OF THE INVENTION

Nowadays, consumer electronics, like toys, mobile phones, tablet computers, and remote controls, are gradually developed to be more intellective. More sensors are contained to perceive more physical quantities. Specifically, the demand for the measurement of stress or pressure generated by human body (especially fingers) gradually increased.

Some special requirements are proposed for the sensors used for the measurement of stress or pressure. Firstly, stress or pressure should be transmitted onto the sensing film effectively; secondly, the sensing film, wires and other parts of a pressure sensing chip should be protected from damage; thirdly, the size of the pressure sensor should be small to meet the growing miniaturization trend of consumer electronics.

Although the producing process of a prior pressure sensing chip with a sensing film has been mature, the sensing film has some disadvantages on the measurement of stress or pressure. Firstly, the sensing film, the thickness of which is normally tens of microns or less, can only be competent for the measurement of fluid pressure; and is easily damaged by external physical pressure generated by human body especially fingers. Secondly, wires, used in a package structure of a prior pressure sensor, are normally exposed above the sensing film. In this case, the wires are also easily damaged if directly touched by human body or fingers. The prior approach to solve above problems is isolating the sensing film through the package structure, by which the pressure generated by human body is converted to fluid pressure on the sensing film. However, the prior package structure may be overprotective and too large, in which the pressure generated by human body cannot be effectively transmitted onto the sensing film; or, the prior package structure cannot adequately protect those easily damaged parts of the pressure sensing chip at all. Furthermore, the prior packaging processes are too complicated.

A packaging method for protecting the sensing film of a pressure sensor chip is disclosed in U.S. Pat. No. 6,401,545, in which a dam is constructed to isolate different parts of the pressure sensor chip. The sensing film is located at one side of the dam, and a kind of soft material is prepared on the sensing film to ensure pressure transmitting. A kind of hard material is prepared to protect the bonding pads and wires around the pressure sensor chip. However, the constructing process of the dam is complicated, and the soft material may still damage the sensing film during transmitting the pressure onto the sensing film.

Another packaging method is disclosed in U.S. Pat. No. 7,148,881, in which a cavity is formed around a pressure sensor. When external force is exerted on the cavity, the pressure change generated by the deformation of the cavity is transmitted to the sensing film. The disadvantage of this method is that the packaging process is complicated and the package structure is too large.

Another package structure is disclosed in China Patent Pat. No. ZL200810021732.3, in which different materials are used in different regions of the pressure sensor, and a pressure transmitting method is proposed for transmitting force and the protection of bonding pads and wires. However, three kinds of material are required in this package structure, which makes the packaging process too complicated.

SUMMARY OF THE INVENTION

According to an embodiment of the present invention, a pressure sensor includes:

a pressure sensing chip, which includes a substrate, a sensing film, an insulation layer and a first bonding pad; wherein the sensing film is on the substrate, and a sagging step is formed at one side of the substrate; the insulation layer is prepared on the sensing film and the substrate; the first bonding pad is prepared on the insulation layer on a bottom surface of the step, and is connected to the region of the substrate close to the sensing film via a lead wire;

an IC chip having a third bonding pad; wherein the pressure sensing chip is attached on the IC chip with the third bonding pad exposed; the first bonding pad is connected to the third bonding pad via a second metal wire; and, a base plate having a second bonding pad; wherein the IC ship is attached on the base plate with the second bonding pad exposed; the second bonding pad is connected to the third bonding pad via a first metal wire.

According to another embodiment of the present invention, a packaging method of a pressure sensor includes:

preparing a pressure sensing chip; wherein the pressure sensing chip includes a substrate, a sensing film, an insulation layer and a first bonding pad; wherein the sensing film is on the substrate, and a sagging step is formed at one side of the substrate; the insulation layer is prepared on the sensing film and the substrate; the first bonding pad is prepared on the insulation layer on a bottom surface of the step, and is connected to the region of the substrate close to the sensing film via a lead wire;

attaching an IC chip having a third bonding pad on a base plate having a second bonding pad with the second bonding pad exposed, and attaching the pressure sensing chip on the IC chip with the third bonding pad exposed;

connecting the second bonding pad with the third bonding pad via a first metal wire, and connecting the first bonding pad with the third bonding pad via a second metal wire.

By forming the sagging step at one side of the pressure sensing chip and placing the first bonding pad on the bottom of the step, the metal wires used for connections in the pressure sensor will not exceed above the sensing film, so the metal wires can be protected from being damaged if directly touched by human body especially fingers. Furthermore, the structure of the pressure sensor can be made thinner easily.

BRIEF DESCRIPTION OF THE DRAWINGS

To give a further description of the embodiments in the present invention or the prior art, the appended drawings used to describe the embodiments and the prior art will be introduced as follows. Obviously, the appended drawings described here are only used to explain some embodiments of the present invention. Those skilled in the art can understand that other appended drawings may be obtained according to these appended drawings without creative work.

DETAILED DESCRIPTION OF THE INVENTION

Throughout the specification and claims, the following terms take the meanings explicitly associated herein, unless the context clearly dictates otherwise. The phrase "in one embodiment" as used herein does not necessarily refer to the same embodiment, though it may. Furthermore, the phrase "in another embodiment" as used herein does not necessarily refer to a different embodiment, although it may. Thus, as described below, various embodiments of the invention may be readily combined, without departing from the scope or spirit of the invention.

In addition, as used herein, the term "or" is an inclusive "or" operator, and is equivalent to the term "and/or," unless the context clearly dictates otherwise. The term "based on" is not exclusive and allows for being based on additional factors not described, unless the context clearly dictates otherwise. In addition, throughout the specification, the meaning of "a", "an", and "the" include plural references. The meaning of "in" includes "in" and "on". The term "coupled" implies that the elements may be directly connected together or may be coupled through one or more intervening elements. Further reference may be made to an embodiment where a component is implemented and multiple like or identical components are implemented.

Figure 5:
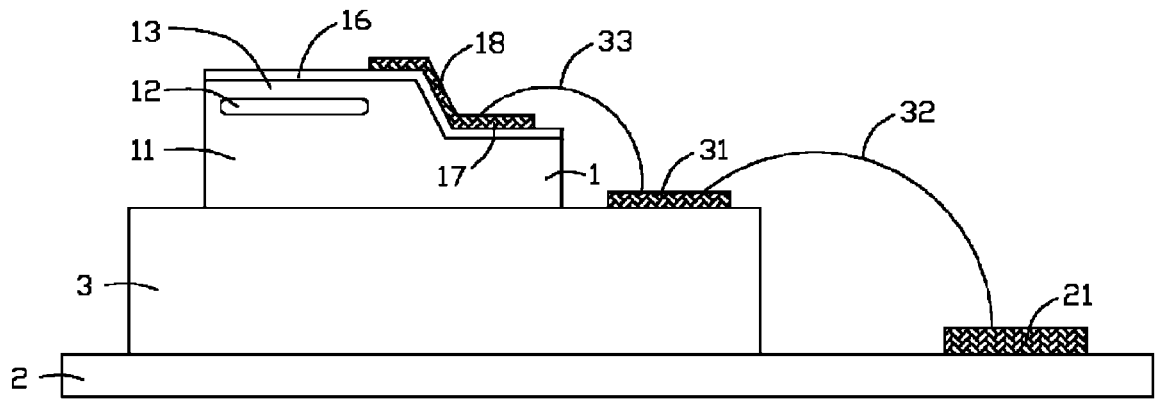
FIG. 5 illustrates the process of attaching the pressure sensing chip and an IC chip on a base plate based on the structure of FIG. 4.
Figure 6:
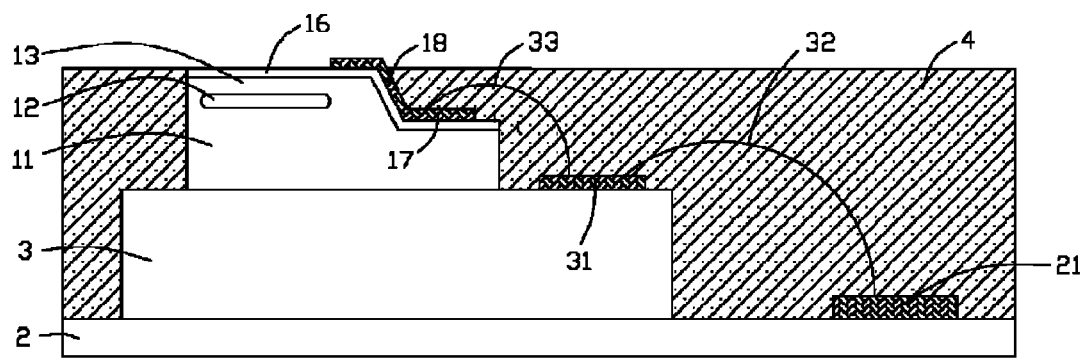
FIG. 6 illustrates the process of preparing hard material through a plastic injection molding process based on the structure of FIG. 5.
Figure 7:
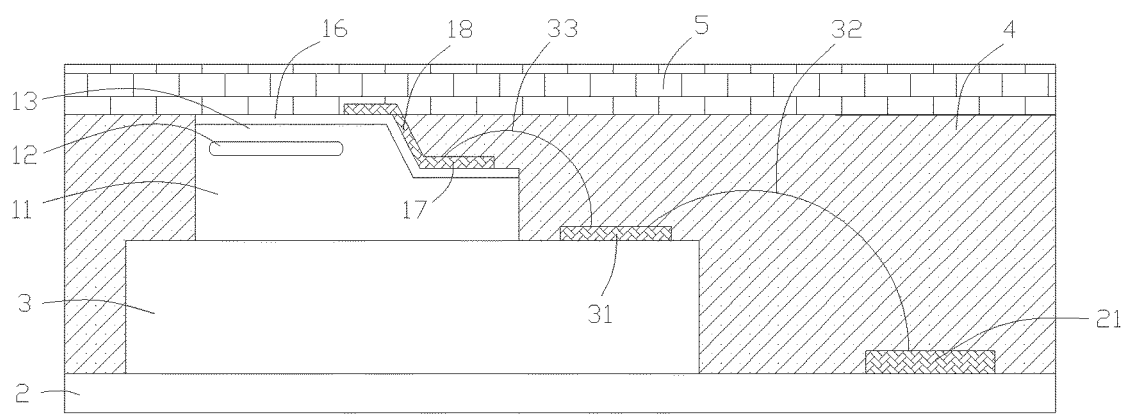
FIG. 7 illustrates the process of preparing an isolation layer made of soft material based on the structure of FIG. 6.

Referring to FIG. 7, a pressure sensor 110 produced though a packaging method illustrated by FIG. 1 to FIG. 7 is provided by an embodiment of the present invention. The following is a brief description of the structure of the pressure sensor 110.

As shown in FIG. 7, the pressure sensor 100 includes a base plate 2 having a second bonding pad 21, an IC chip 3 having a third bonding pad 31 and attaching on the base plate 2, a pressure sensing chip attaching on the IC chip 3, hard material used for package and soft material 5 covering on the hard material 4 and the sensing film 13. The pressure sensing chip includes a substrate 11, a flat chamber 12 and a sensing film 13 coupled with the chamber 12; the volume of the chamber 12 can change with the vibration of the sensing film 13. Before being packaged, the pressure sensing chip includes a sagging step 15 located at one side of the substrate 11, an insulation layer 16 deposited on the sensing film 13 and the step 15, a first bonding pad 17 prepared on the insulation layer 16 on bottom surface of the step 15 and a lead wire 18 connecting the first bonding pad 17 with the region of the substrate 11 close to the sensing film 13. The second bonding pad 21 is connected with the third bonding pad 31 through a first metal wire 32, and the first bonding pad 17 is connected with the third bonding pad 31 through a second metal wire 33. The IC chip 3, the first bonding pad 17, the second bonding pad 21, the third bonding pad 31, the first metal wire 32 and the second metal wire 33 are packaged in the hard material 4.

The electrical signal coming from the pressure sending chip is processed and amplified by the IC chip 3, and then is transmitted to the second bonding pad 21. The third bonding pad 31 is on the IC chip 3. The IC chip 3 is attached on the base plate 2 with the first bonding pad 21 exposed. Similarly, the pressure sensing chip is attached on the IC chip 3 with the third bonding pad 31 exposed.

The height of the chamber 12 is small. The step 15 makes the height of the first bonding pad 17 below the sensing film 13. The insulation layer 14 makes the lead wire 18 isolated from the substrate 11 to avoid a short circuit. The lead wire 18 leads the electric signal generated around the sensing film 13 to the first bonding pad 17 via the step 15.

In an embodiment of the present invention, a chamber 12 may not be included in a substrate 11 of a pressure sensing chip; the pressure sensing chip may apply another internal structure. For example, the pressure sensing chip may only include a substrate 11, a sensing film 13 used for perceive external stress and prepared on the substrate 11, a first bonding pad 17 and an insulation layer 16 deposited on the sensing film 13 and the substrate 11. A sagging step 15 is formed at one side of the substrate 11; the first bonding pad 17 is prepared on the insulation layer 16 on the bottom surface of the step 15; and the first bonding pad 17 is connected to the region of the substrate 11 close to the sensing film 13 via a lead wire 18.

As shown in FIG. 7, the sensing film 13 is not covered by the hard material 4. The soft material 5 is used for transmitting external force and protects the sensing film 13 from being directly toughed by external force.

The above structure of the pressure sensor 110 can be drawn clearly based on the following description of a packing method illustrated by FIG. 1 to FIG. 7.

FIG. 1~FIG. 7 illustrate a packaging method of a pressure sensor. The packaging method includes following steps:

(a). a semi-finished product 1 of a pressure sensing chip is provided. The semi-finished product 1 includes a substrate 11, a chamber 12 and a sensing film 13 coupled with the chamber 12. The chamber 12 is formed in the substrate 11 and below the sensing film 13; and the volume of the chamber 12 can change with the vibration of the sensing film 13.

(b). a patterned protective layer 14 is prepared on the sensing film 13 to protect the sensing film from being corroded by the following corrosion step.

(c). alkaline solution is applied to corrode the substrate 11, and a sagging step 15 is formed by the corrosion at one side of the substrate 11 where there isn't the chamber 12;

(d). the protective layer 14 is removed, and then an insulating layer 16 is prepared on the sensing film 13 and the step 15; a first bonding pad 17 is prepared on the insulating layer 16 on the bottom surface of the step 15, and a lead wire 18 is prepared to connect the first bonding pad 17 with the region of the substrate 11 close to the sensing film 13;

(e). a base plate 2 having a second bonding pad 21 and a IC (integrated circuit) chip 3 having a third bonding pad 31 are provided; the IC chip 3 is attached on the base plate 2 with the second bonding pad 21 exposed, and the pressure sensing chip is attached on the IC chip 3 with the third bonding pad 31 exposed;

(f). through wire-bonding processes, a first metal wire 32 is prepared to connect the second bonding pad 21 with the third bonding pad 31, and a second metal wire 33 is prepared to connect the first bonding pad 17 with the third bonding pad 31;

(g). through a plastic injection molding process, hard material 4 is prepared to package the IC chip 3, the first bonding pad 17, the second bonding pad 21, the third bonding pad 31, the first metal wire 32 and the second metal wire 33; and the sensing film 13 is kept exposed;

(h). an isolation layer made of soft material 5 is prepared to cover the hard material 4 and the sensing film 13.

Figure 1:
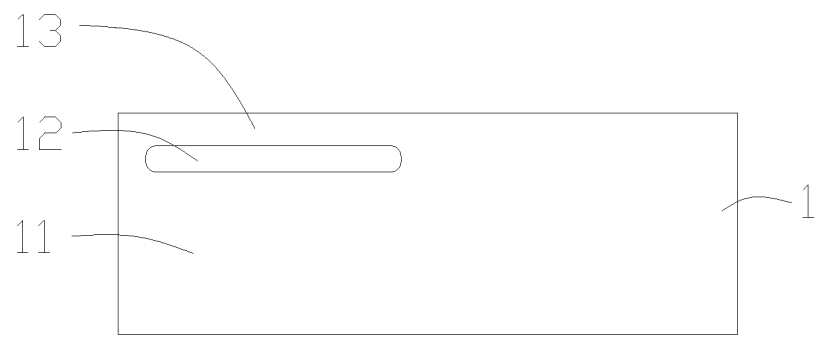
FIG. 1 illustrates the structure of a semi-finished product of a pressure sensing chip in an embodiment of the present invention.

As shown in FIG. 1, in an embodiment of the present invention, the pressure sensing chip may be produced through a SENSA process. The chamber 12 of the pressure sensing chip may be in a flat shape having a small height, so that when the sensing film 13 is deformed by external force, excessive deformation will be blocked by the region of the substrate 11 below the sensing film 13. Thus, the sensing film 13 is not easy to be broken and can tolerate more powerful external stess, such as direct stress coming from human fingers or other external physical pressure. The sensing film 13 can be protected from damage when the pressure coming from human body especially fingers is transmitted onto it.

Figure 2:
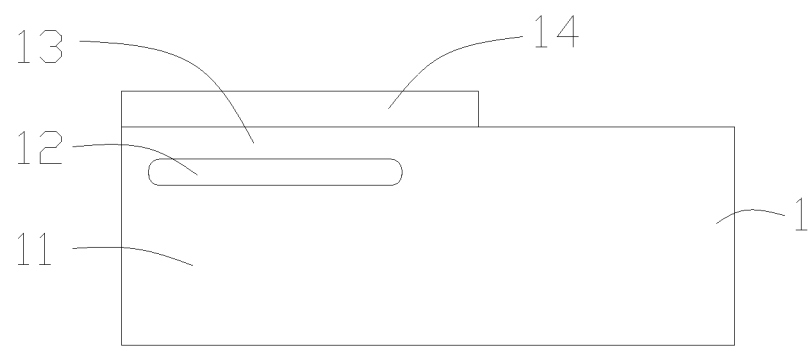
FIG. 2 illustrates the process of preparing a protective layer based on the structure of FIG. 1.

As shown in FIG. 2, in the step of (b), the protective layer 14 is on the sensing film 13 to play a protective role. In an embodiment of the present invention, the protective layer 14 may be prepared through deposition, photolithography, and reactive ion etching processes. The protective layer 14 is prepared at one side of the substrate 11 where there is the sensing film 13, and the other side of the substrate 11 is kept exposed.

Figure 3:
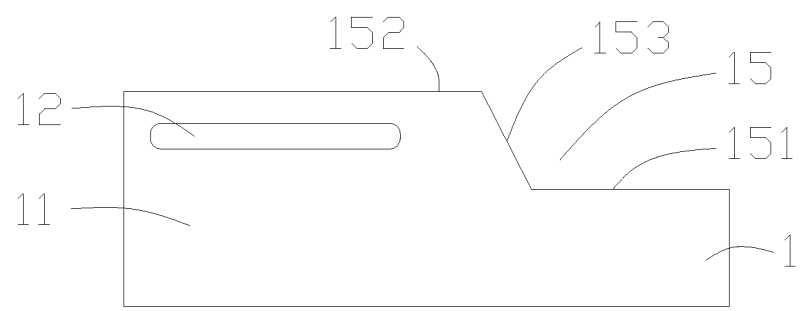
FIG. 3 illustrates the process of forming a sagging step by corrosion based on the structure of FIG. 2.

As shown in FIG. 3, in the step of (c), the alkaline solution may be tetramethylammonium hydroxide (TMAH) or potassium hydroxide (KOH). In an embodiment of the present invention, the step 15 includes a bottom surface 151, a top surface 152 and an inclined surface 153 which connects the bottom surface 151 with the top surface 152. At least a portion of the insulating layer 16 covers the bottom surface 151, the top surface 152 and the inclined surface 153.

Figure 4:
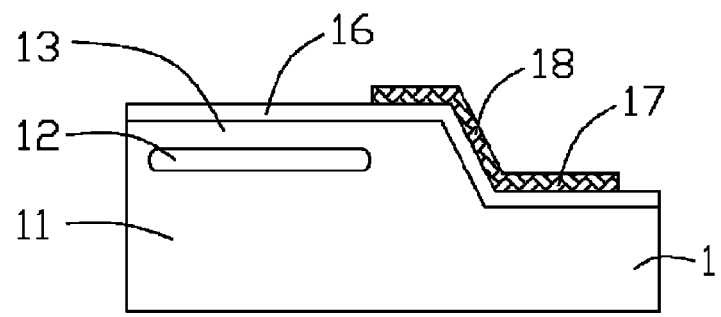
FIG. 4 illustrates the processes of depositing an insulation layer and preparing a first bonding pad and a wire based on the structure of FIG. 3.

As shown in FIG. 4, in the step of (d), the protective layer 14 is removed through a dry/wet etching process. Then the first bonding pad 17 and the lead wire 18 are prepared though lithography, etching and other processes.

As shown in FIG. 5, in the step of (e), through dispensing, chip bonding and other processes, the IC chip 3 is attached on the base plate 2; also through dispensing, chip bonding and other processes, the pressure sensing chip is attached on the IC chip 3. In an embodiment of the present invention, the first bonding pad 17 is placed higher than the third bonding pad 31, and the third bonding pad 31 is placed higher than the second bonding pad 21. Furthermore, the first bonding pad 17, the second bonding pad 21 and the third bonding pad 31 are all placed below the sensing film 13. The base plate 2 may consist of a wire frame and PCB/resin.

Compared with prior pressure sensing chips, the sagging step 15 is included in the present invention and the first bonding pad 17 is prepared on the bottom surface of the step 15. In the step of (f), the vertex of the first metal wire 32 and the vertex of the second metal wire 33 are all lower than the sensing film 13, so that the first metal wire 32 and the second metal wire 33 can be protected from damage and the package structure can be made thinner easily. However in the structure of the prior pressure sensing chip, the bonding pads and the sensing film are prepared in the same plane, so the metal wires exceeds the height of the sensing film and are easily to be damaged. Furthermore, the detail package process is consistent with the current package process of integrated circuits, which is mature and simple.

As shown in FIG. 6, in the step of (g), the hard material 4 may be made of resin. Since the first bonding pad 17, the second bonding pad 21, the third bonding pad 31, the first metal wire 32, the second metal wire 33 and the lead wire 18 are all packaged in the hard material 4, they will not be corroded by outside corrosive gas and will not be severely deformed. The first metal wire 32 and the second metal wire 33 will not be broken.

As shown in FIG. 7, in the step of (h), the soft material 5 may be silica gel. By preparing the soft material 5, the sensing film 13 can be isolated from external force, and the external force can be transmitted onto the sensing film 13.

In an embodiment of the present invention, the semi-finished product 1 of the pressure sensing chip may not include the chamber 12, and may apply another internal structure. For example, the sensing film 13 in the semi-finished product 1 may not be formed through a SENSA process, but be formed through an anisotropic etching process on the back of the substrate 11. In this case, the sagging step 15 may be formed directly on the substrate 11 without considering the position of the chamber 12.

The order of the steps in the present embodiment is exemplary and is not intended to be a limitation on the embodiments of the present invention. It is contemplated that the present invention includes the process being practiced in other orders and/or with intermediary steps and/or processes.

The above contents are the descriptions of the preferred embodiments of the present invention, which cannot be used to limit the protection scope of the present invention. Under the principle and the novel feature of the present invention, any modifying, equivalent replacement, improvement, etc. are all considered to be within the protection scope of the present invention.

The invention claimed is:

1. A pressure sensor, comprising:
    a pressure sensing chip, which comprises a substrate, a sensing film, an insulation layer and a first bonding pad; wherein the sensing film is on the substrate, and a sagging step is formed at one side of the substrate; the insulation layer is prepared on the sensing film and the substrate; the first bonding pad is prepared on the insulation layer on a bottom surface of the step, and is connected to the region of the substrate close to the sensing film via a lead wire;
    an IC chip having a third bonding pad; wherein the pressure sensing chip is attached on the IC chip with the third bonding pad exposed; the first bonding pad is connected to the third bonding pad via a second metal wire; and,
    a base plate having a second bonding pad; wherein the IC ship is attached on the base plate with the second bonding pad exposed; the second bonding pad is connected to the third bonding pad via a first metal wire.

2. The pressure sensor of claim 1, wherein the pressure sensing chip further comprises a chamber; the chamber is formed in the substrate and below the sensing film, and the volume of the chamber changes with the vibration of the sensing film.

3. The pressure sensor of claim 1, wherein the step comprises the bottom surface, a top surface and an inclined surface which connects the bottom surface with the top surface; wherein at least a portion of the insulating layer covers the bottom surface, the top surface and the inclined surface.

4. The pressure sensor of claim 3, further comprising hard material, prepared to package the IC chip, the first bonding pad, the second bonding pad, the third bonding pad, the first metal wire and the second metal wire; wherein the sensing film is exposed from the hard material.

5. The pressure sensor of claim 4, further comprising an isolation layer made of soft material, prepared to cover the hard material and the sensing film.

6. The pressure sensor of claim 5, wherein the hard material comprises resin; and/or, the soft material comprises silica gel.

7. The pressure sensor of claim 1, wherein a vertex of the first metal wire and a vertex of the second metal wire are all lower than the sensing film.

8. The pressure sensor of claim 1, wherein the first bonding pad is placed higher than the third bonding pad, and the third bonding pad is placed higher than the second bonding pad; the first bonding pad, the second bonding pad and the third bonding pad are all placed below the sensing film.

9. A packaging method of a pressure sensor, comprising:
preparing a pressure sensing chip; wherein the pressure sensing chip comprises a substrate, a sensing film, an insulation layer and a first bonding pad; wherein the sensing film is on the substrate, and a sagging step is formed at one side of the substrate; the insulation layer is prepared on the sensing film and the substrate; the first bonding pad is prepared on the insulation layer on a bottom surface of the step, and is connected to the region of the substrate close to the sensing film via a lead wire;
attaching an IC chip having a third bonding pad on a base plate having a second bonding pad with the second bonding pad exposed, and attaching the pressure sensing chip on the IC chip with the third bonding pad exposed;
connecting the second bonding pad with the third bonding pad via a first metal wire, and connecting the first bonding pad with the third bonding pad via a second metal wire.

10. The packaging method of claim 9, wherein preparing a pressure sensing chip comprises:
providing a semi-finished product of the pressure sensing chip; wherein the semi-finished product includes the substrate and the sensing film on the substrate;
preparing a protective layer on the sensing film to protect the sensing film from being corroded;
forming the sagging step at one side of the substrate through a corrosion process;
removing the protective layer and then preparing the insulating layer on the sensing film and the step;
preparing the first bonding pad on the insulation layer on the bottom surface of the step;
connecting the first bonding pad to the region of the substrate close to the sensing film via the lead wire.

11. The packaging method of claim 10, wherein the semi-finished product further comprises a chamber; wherein the chamber is formed in the substrate and below the sensing film, and the volume of the chamber changes with the vibration of the sensing film;
thus forming the sagging step at one side of the substrate through a corrosion process comprises:
forming the sagging step at one side of the substrate where there isn't the chamber.

12. The packaging method of claim 11, wherein the protective layer is prepared through deposition, photolithography, and reactive ion etching processes.

13. The packaging method of claim 11, wherein the protective layer is removed through a dry/wet etching process.

14. The packaging method of claim 11, wherein the sagging step is formed by using alkaline solution to corrode one side of the substrate.

15. The packaging method of claim 14, wherein the alkaline solution comprises tetramethylammonium hydroxide and potassium hydroxide.

16. The packaging method of claim 9, further comprising:
preparing hard material to package the IC chip, the first bonding pad, the second bonding pad, the third bonding pad, the first metal wire and the second metal wire; wherein the sensing film is exposed from the hard material.

17. The packaging method of claim 16, wherein the hard material is prepared through a plastic injection molding process.

18. The packaging method of claim 17, further comprising:
preparing soft material to cover the hard material and the sensing film.

19. The packaging method of claim 9, wherein the IC chip is attached on the base plate through dispensing and chip bonding processes; and/or, the pressure sensing chip is attached on the IC chip through dispensing and chip bonding processes.

20. The packaging method of claim 9, wherein a vertex of the first metal wire and a vertex of the second metal wire are all lower than the sensing film.

* * * * *